United States Patent [19]
Porche et al.

[11] Patent Number: 4,590,416
[45] Date of Patent: * May 20, 1986

[54] CLOSED LOOP POWER FACTOR CONTROL FOR POWER SUPPLY SYSTEMS

[75] Inventors: Michael N. Porche, Houston; Louis G. Beauregard, Stafford, both of Tex.

[73] Assignee: Rig Efficiency, Inc., Houston, Tex.

[*] Notice: The portion of the term of this patent subsequent to Nov. 13, 2001 has been disclaimed.

[21] Appl. No.: 670,163

[22] Filed: Nov. 9, 1984

Related U.S. Application Data

[62] Division of Ser. No. 521,119, Aug. 8, 1983, Pat. No. 4,482,857.

[51] Int. Cl.⁴ ............................................. G05F 1/70
[52] U.S. Cl. ................................. 323/205; 323/212; 322/20; 307/84
[58] Field of Search ........................ 307/83, 84, 87; 323/205, 212, 215; 322/20, 37; 318/729

[56] References Cited

U.S. PATENT DOCUMENTS 4,482,857 11/1984 Porche et al. ................... 307/84 X

FOREIGN PATENT DOCUMENTS 68963  6/1979 Japan ...................................... 323/205
905940 2/1982 U.S.S.R. ................................. 323/205

OTHER PUBLICATIONS

*Synchronous Condensers for Steel Mill Service* by Pollard Iron and Steel Engineer, Jul., 1955.
*Arc-Furnace Loads on Long Transmission Lines* by LeClair Electrical Engineering Transactions, 4-1940.
*Negative Damping of Electrical Machinery* by Concordia and Carter, Electrical Engineering Transactions, 3-1941.

*Primary Examiner*—A. D. Pellinen
*Assistant Examiner*—Derek S. Jennings
*Attorney, Agent, or Firm*—Pravel, Gambrell, Hewitt & Kimball

[57] ABSTRACT

A power factor controller for alternating current/direct current drilling rigs is provided which utilizes a uniquely controlled, unloaded, over-excited generator to provide reactive power to maintain the rig's power factor within prescribed limits during peak demand operations.

20 Claims, 3 Drawing Figures

CLOSED LOOP POWER FACTOR CONTROL FOR POWER SUPPLY SYSTEMS

This a division of application Ser. No. 521,119 filed Aug. 8, 1983, U.S. Pat. No. 4,482,857.

BACKGOUND OF THE INVENTION

1. Field of Invention

The present invention relates to controlling the power factor of an alternating current/direct current, silicon controlled rectifier drilling rig such as are used for drilling oil and gas wells.

2. Description of Prior Art

In the petroleum industry, the apparatus and machinery used to drill wells is commonly known as a drilling rig or a rig. Over the years, various types of rigs have been used by the industry and have been classified either by reference to the type of power used on board the rig to provide the motive force necessary to turn the drill bit or perform the other rig operations or as to the type of terrain on which the rig is situated. For example, a rig may be termed an "offshore" rig if it is one used for offshore drilling, but more commonly rigs are referred to as mechanical, DC/DC "Ward-Leonard" or AC/DC rigs depending upon the type of power coupling used to provide motive force for the drilling operations. Mechanical rigs used dedicated diesel engines which were clutched to mechanically engage various aspects of the rigs machinery to perform the operations of drilling, pumping, and lifting the drill string when appropriate. DC/DC rigs used dedicated diesel-electric motor/generator combinations to perform each of the necessary drilling functions in the same fashion as the mechanical-clutched rigs.

For the last decade, many AC/DC rigs were built using silicon controlled rectifier AC to DC converters, and hence have been referred to as "SCR" rigs. AC/DC or "SCR" rigs use a pool of diesel engine-AC generator sets to provide alternating current power to a rig bus from which DC motors or other AC or DC equipment draw power to perform various rig functions. Recently, because of their inherent advantages, SCR rigs have become preferred by the industry. SCR rigs are more tolerant to the loss of a particular diesel engine due to a maintenance requirement or similar problem, are less prone to maintenance difficulties in general, are easily assembled on a drilling rig and are generally less expensive to set up and operate than other types of rigs.

SCR rigs typically used three phase, full control, line commutated silicon controlled recifier, two-way AC to DC converter bridges. These SCR converter bridges operated at a power factor which was approximately equal to the ratio of actual output to full voltage output capability. Because these converters were line commutated, the fundamental component of current always lagged the voltage, hence a lagging power factor was characteristic of SCR rigs. SCR rigs used electric DC motors to drive various rig tools or functions such as mud pumps which were used to provide drilling fluid during drilling operations. Because electrically driven mud pumps required high pressure (high current), low speed (low voltage) operation, it was not uncommon that rigs operated during pumping operations at power factors of 0.4 or 0.5 lagging. The operation at such low power factors frequently required that more diesel engine-generator sets than necessary to provide the real power requirements be operated solely to provide the necessary reactive power (Kilovolt-amperes-reactive, hereinafter KVAR) because of the poor power factor of the operating rig. Thus, SCR drilling rigs typically operated at very inefficient levels consuming excess fuel simply to have standby KVAR available when required. The problem was aggravated due to the specific fuel consumption characteristics of diesel engines which typically consume some fuel per horsepower-hour when lightly loaded than when fully loaded.

Another problem encountered during drilling operations is related to the need to be able to lift up on the drill string without shutting down mud pumps to make a connection or lengthen the drill string. In the past, due to an insufficient KVAR supply the lifting capacity of the rig was limited during pumping operations. In order to add more string to the drill string, it was necessary to either shut down the pumps or bring an additional engine-generator set on line to provide for peak power demands during operation of the draw works and pumps simultaneously, or during tripping of the drill string.

Generally speaking, the prior art has attempted to solve the problem presented during peak demand operations due-to poor power factors in one of three ways:

1. The two motors driving mud pumps were connected in series to limit the current demand placed upon the power generation system. This solution was obviously not effective on single motor mud pumps, or when as commonly occurred, pumps had to be run at a greater than 50% speed to produce the required volume. Furthermore, even if pumps were placed in series, it was still necessary to provide additional engine-generator sets to provide KVAR for the draw works during tripping operations or when making additional connections.

2. Banks of capacitors were installed on the rig bus to supply a fixed amount of leading KVAR. This attempted solution also had several disadvantages. At low loads, the corrected power factor could be as poor leading as a result of the added KVAR as it was lagging without the compensation by the capacitors. Because the available power factor compensation was voltage dependent, and an increased KVAR demand (low voltage) was not met by an increased capability to compensate the power factor, voltage regulation was adversely affected. Furthermore, system short circuit current was significantly increased, often beyond the original rig design limits, and the introduction of capacitance gave the system both sub-synchronous and super-synchronous resonant frequencies not easily calculated but within the range of excitation by the SCR drive system, thereby creating potential system stability problems.

3. The rig generators were oversized, such that it was not uncommon to find 1500 KVA generators on 850 KW engines. Even this solution was not often sufficient and was expensive when done for all engine-generator sets. Aside from the higher initial capital expense required to provide oversize generators, the operation of oversized lightly loaded generators was inherently inefficient.

SUMMARY OF THE INVENTION

In contrast to the prior art systems, the system of the present invention provides a uniquely controlled, unloaded, over-excited generator operating in a motor mode to supply leading KVAR as required to maintain rig power factor within the prescribed limits. The system of the present invention does not require more capital investment than other unsatisfactory solutions such as oversizing the generator sets. Furthermore, the system of the present invention lowers the field heating of on-line generators, reduces rig fuel consumption, increases the useful life of on-line generator sets, and improves rig voltage regulation as well. The generator used for the present invention may be any conventional 2-bearing generator that is suitable for extended low power factor operation without destructive field heating. In selecting a particular generator for this application, consideration should also be given to the compatability of the generator with existing power generation systems on board the rig and to minimizing the system start-up requirements. Given the particular application, as will be described herein, the selection of a suitable generator based upon the system criteria is a matter within the ordinary skill of the art.

DESCRIPTION OF THE PREFERRED EMBODIMENT

Figure 1:
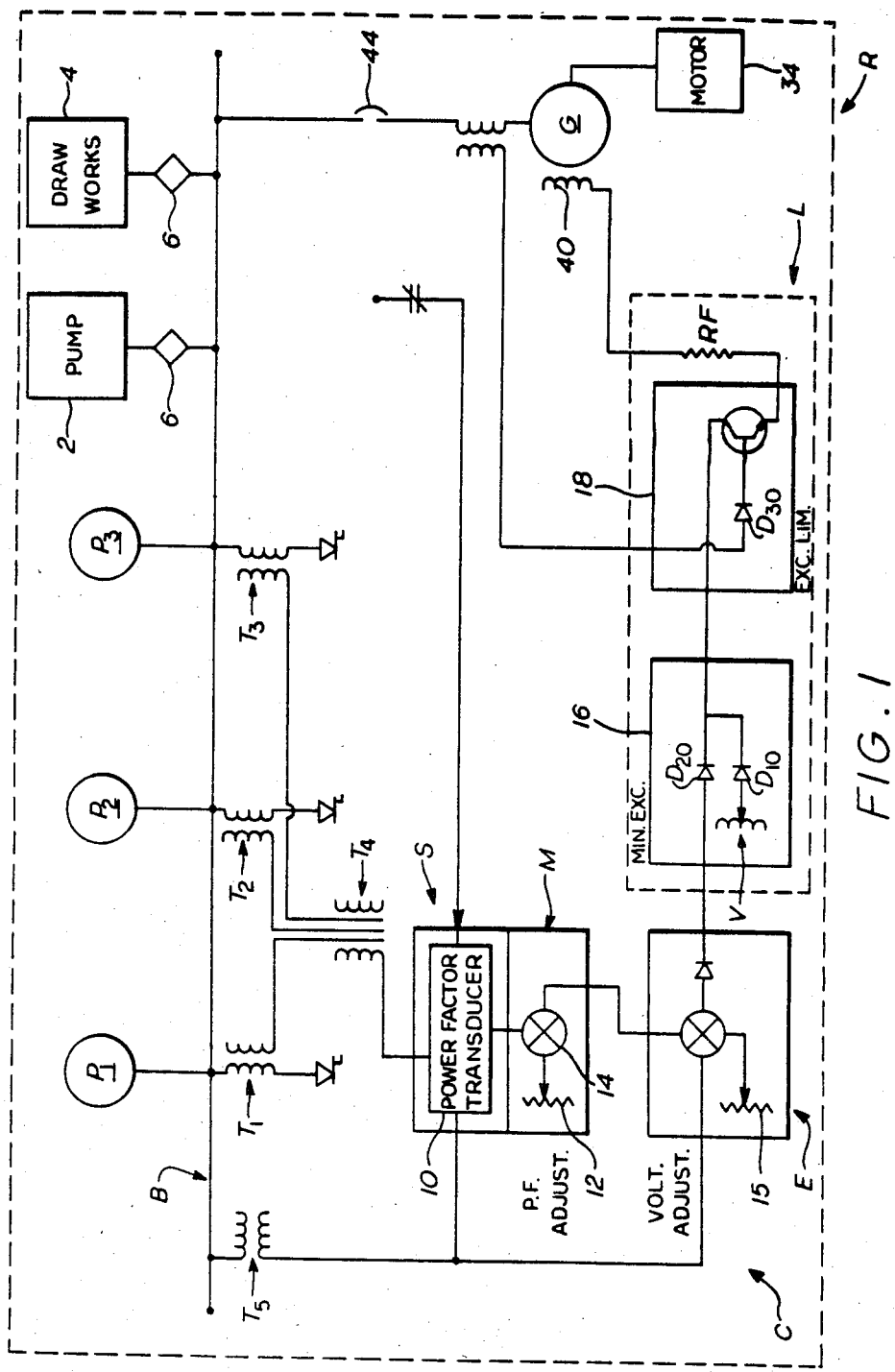
FIG. 1 is a schematic block diagram of the control system of the present invention.

In the drawings, the letter C designates generally a power factor controller according to the present invention in association with a typical silicon controlled rectifier (SCR) AC/DC drilling rig R shown schematically in FIG. 1. A typical SCR rig includes a number of diesel engine/generator sets such as are designated P1, P2 and P3 for supplying alternating current electric power to a central rig bus B. Power for various rig functions and services is provided on bus B and converted to direct current to power DC motors and machines such as mud pumps 2 and draw works 4 which are illustrated schematically in FIG. 1. On an SCR rig, AC power is converted to DC using silicon controlled rectifier converter bridges 6 also illustrated schematically in FIG. 1. As noted previously, without power factor compensation, the use of SCR converters inherently causes the rig to operate at power factors as low as 0.4 to 0.5.

Controller C is comprised of a power factor sensor S which senses the instantaneous rig power factor, a power factor monitoring circuit M, an excitation controller E and a generator G. Monitor M compares the instantaneous power factor to prescribed limits and provides a power factor difference signal to excitation controller E which thereafter provides excitation voltage to generator G to correct system power factor within prescribed limits. The reactive power output of generator G operating in a motor mode is thus dependent upon the control signal received from monitor M. Generator G provides KVAR within prescribed limits as necessary to maintain the prescribed rig power factor. Limiter L is provided to maintain the excitation current provided to generator G within the prescribed upper and lower operational limits.

Referring now to the drawings in greater detail, in FIG. 1, power factor sensor S includes current transformers T1, T2 and T3 in association with engine/generator sets P1, P2 and P3 respectively. Transformers T1, T2 and T3 provide a current signal in phase with the output current of the engine/generators P1, P2 and P3. This current signal is used to derive the instantaneous power factor of the power being provided to bus B. In the illustrated embodiment, current signals from T1, T2 and T3 are provided to a summing current transformer T4 which vectorially sums the current signals to provide a system current signal comprising phase and amplitude components.

System voltage is detected by voltage transformer T5 and provided to power factor transducer 10. A system power factor is then derived by power factor transducer 10, which determines the cosine of the phase angle between system voltage and the composite system current signal provided from transformer T4. Power factor transducer 10 may be any conventional power factor metering transducer as are commonly available which provides a suitable output voltage signal indicative of the power factor of the system voltage and current.

The power factor output signal from transducer 10 is provided to monitor circuit M. Monitor circuit M includes a rheostat 12 for setting the desired system power factor and a comparator 14 which provides an output analog voltage signal proportional to the difference between the desired power factor and the sensed power factor. Comparator 14 may be any suitable conventional comparator circuit, such as a differential amplifier and associated circuitry. Design of such an appropriate comparator circuit is within the ordinary skill of those in the art and detailed schematic is not necessary. Thus monitor M provides, as an output, a power factor control signal which is dependent upon the difference between the sensed system power factor and the prescribed system power factor. This output voltage signal is provided as a control input to excitation controller E.

Excitation controller E is a voltage controlled high power voltage source suitable for providing excitation current for generator G at a level proportionate to the power factor control correction voltage signal received from monitor M. Excitation controller E must be selected to provide the particular excitation requirements of the generator G in accordance with the generator manufacturer's specifications. Excitation controller E is provided with a rheostat 15 for calibrating controller E with respect to actual line voltage on the rig as sensed by transformer T5. Excitation controller E may be any conventional high power voltage source suitable for providing the necessary excitation voltage for generator G in response to the voltage input signal from monitor M.

The field excitation current which is provided to generator G is maintained within prescribed limits by limiter circuit L (FIG. 1). Limiter circuit L includes lower limit circuit 16 which limits the excitation current provided to generator G to that necessary to prevent the generator from absorbing rather than generating vars so that the rig may operate at a power factor better than the prescribed power factor where circumstances permit. Limiter L also includes a second circuit 18 for preventing the excitation current provided to generator G from exceeding prescribed limit which is set by the manufacturer. In the preferred embodiment this upper limit is adjusted to account for changes in the sensed generator output.

Figure 2:
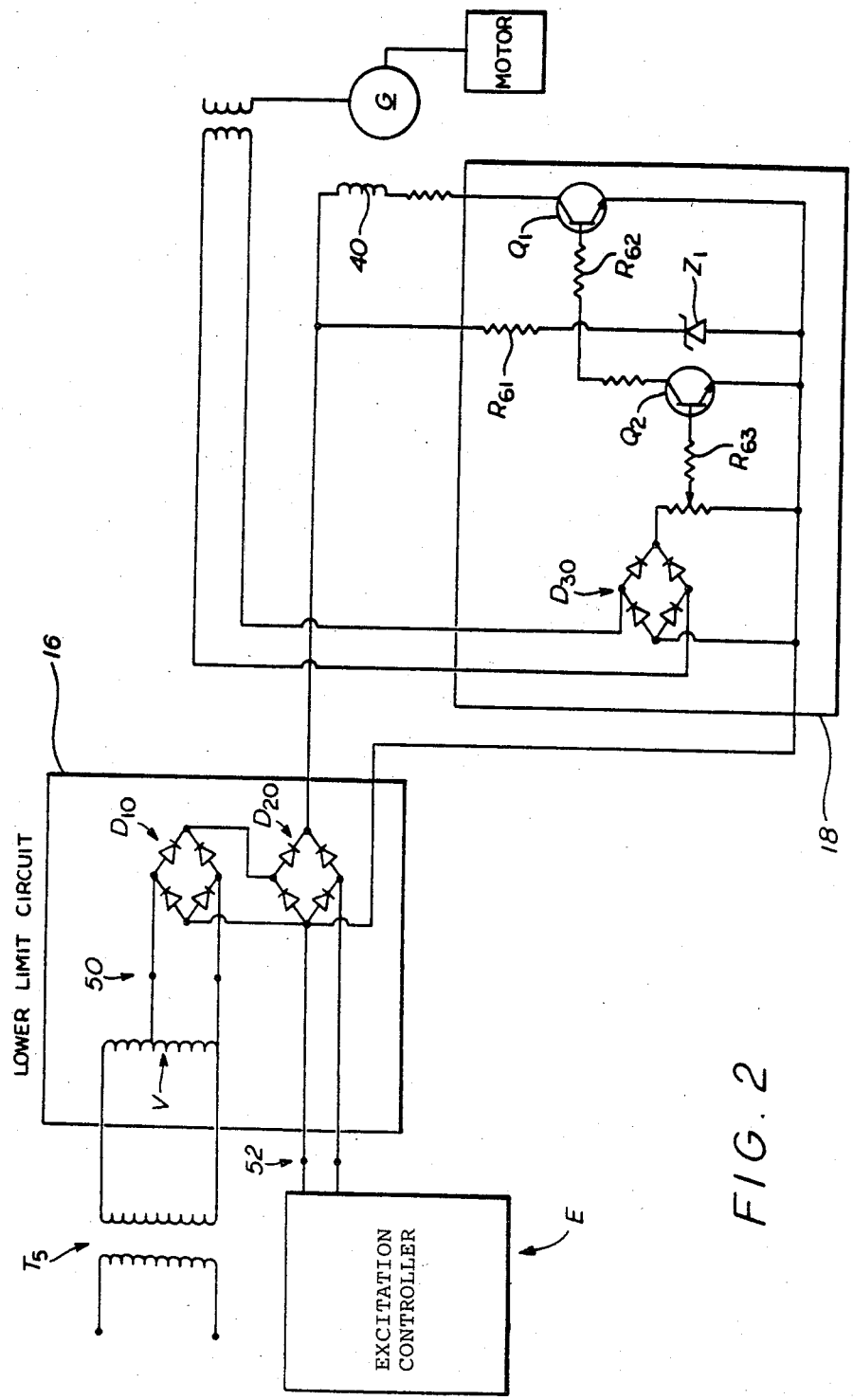
FIG. 2 is a schematic diagram of a portion of the control system of FIG. 1.

Referring now to FIG. 2, circuit 16 includes an adjustable voltage source such as variable autotransformer V, a first diode bridge circuit D10, and a second diode bridge circuit D20. Variable autotransformer V is connected to system voltage via transformer T5, and adjusted to provide an output voltage at terminal 50 equal to the prescribed minimum excitation voltage for generator G. The excitation voltage provided by excitation controller E at terminal 52 is compared by diode bridge D20 to a minimum excitation level set by variable autotransformer V and diode bridge D10. Thus, where the voltage at terminal 52 exceeds the minimum voltage at terminal 50, the higher level of excitation at terminal 52 is applied to field windings 40 of generator G via diode bridge D20. On the other hand, should the excitation voltage provided from controller E at terminal 52 fall below the minimum voltage provided at terminal 50, the latter minimum voltage is provided to generator G assuming that the prescribed minimum voltage will be maintained.

Circuit 18 includes biasing circuit resistors R61, R62, zener diode Z1, transistors Q1, Q2, diode bridge D30 and resistor network R63. The characteristics of resistors R61, R62 and zener diode Z1 are selected so that transistor Q1 is enabled and biased in its resistive region during normal operation of generator G within prescribed upper excitation limits. If the output from generator G, which is sensed by current transformer T6 and rectified by diode bridge D30, begins to exceed its maximum KVAR limit, then transistor Q2 begins to conduct, placing transistor Q1 in its control region and limiting the maximum excitation current provided to generator G. The specific circuit parameters for resistor network R63, and the remaining elements of circuit 18 are matters within the ordinary skill in the art and need not be specified herein.

Excitation current from limiter L is provided to the field windings 40 of generator G. Generator G is a 2-bearing generator operated in a motor mode at a low power factor but within the prescribed KVAR limit to avoid destructive field heating. Selection of an appropriate operating limit is made with reference to the reactive capability curves for the particular generator provided by the manufacturer. Since generator G is operated in this motor mode, it provides reactive power (KVAR) to rig bus B via switch 44 as is necessary to compensate the system power factor to bring it within prescribed limits. The output KVAR is directly proportional to the excitation current provided to field 40 from excitation controller E as limited by limiter L. Thus, generator G provides KVAR on demand to maintain the system power factor within prescribed limits, thereby maximizing efficiency of the rig engine/generator sets. Since generator G is a synchronous machine, an auxiliary start-up motor or engine 34 is provided to bring generator G to near synchronous speed with generator sets P1, P2 and P3 prior to placing controller C on line.

Figure 3:
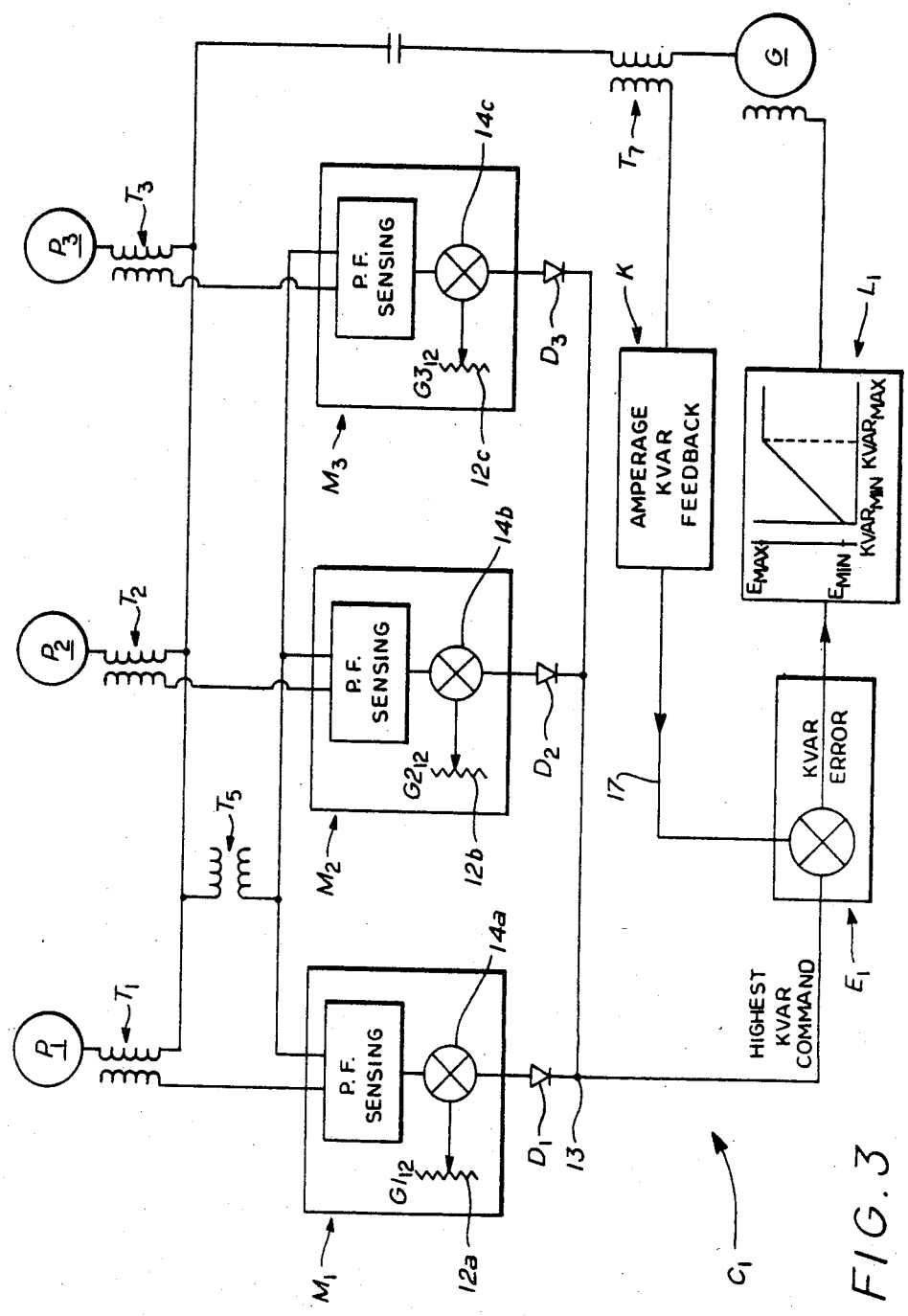
FIG. 3 is a schematic block diagram of another embodiment of the control system of the present invention.

Referring to FIG. 3, an alternative embodiment of the present invention designated generally as C1 is illustrated. For ease of reference, those elements of control C1 which are common to control C, illustrated in FIG. 1 are given similar designations in FIG. 3. In control C1, individual current signals from T1, T2 and T3 are individually compared to the system voltage from T5 by separate monitoring circuits M1, M2 and M3.

Monitors M1, M2 and 3 include individual rheostats 12a, 12b and 12c respectively to enable control C1 to individually monitor the power factor of each particular engine-generator set P1, P2 and P3. Individual comparators 14a, 14b and 14c provide output analogue voltage signals proportional to the difference between the desired individual power factors and the sensed individual power factors. Hence, the magnitude of these output analogue voltage signals is proportionate to the amount of leading KVAR necessary to correct the individual power factors to be within the prescribed limits.

Diode D1, D2 and D3 are connected to the outputs of comparators 14a, 14b and 14c respectively and to a common junction 13. The voltage at junction 13 will be the highest of the analogue voltage signals from comparators 14a, 14b and 14c less the voltage drop across the diode D1, D2 or D3. Thus, D1, D2 and D3 form a network which selects the analogue voltage signal indicative of the greatest KVAR demand from the individual engine-generator sets P1, P2 and P3 and supplies that voltage signal to excitation controller E1. In this embodiment, excitation controller E1 is a voltage controlled high power voltage source suitable for providing excitation current to generator G1. In this embodiment, excitation controller E1 is provided a second input signal representing sensed instantaneous system KVAR via current transformer T7 and feedback circuit K. Since the output of generator G is virtually all reactive, i.e., the real power components are negligent, the current signal provided via transformer T7 and feedback K is substantially equal to the instantaneous KVAR being provided by generator G. Circuit K converts this sensed system current signal to an analogue voltage output signal 17 which represents sensed system KVAR. Excitation controller E1, subtracts this instantaneous KVAR signal 17 from the voltage signal provided at terminal 13 representing the greatest KVAR demand from the individual engine-generator sets P1, P2 and P3 and provides an output excitation voltage for generator G1 which is proportionate to the difference between the instantaneous system KVAR (17) and the highest KVAR demand (13). The output excitation voltage from excitation controller E1 is contained within prescribed limits by limiter L1 in the same fashion described above with respect to limiter L.

In this fashion, monitor M is adapted to provide a system power factor control signal to excitation controller E and generator G as necessary to compensate the particular engine-generator set with the highest KVAR demand. By sensing individual power factors the power system is made more tolerant of the sometimes poor KVAR and KW load sharing characteristics of diesel engine-generator sets. Furthermore, such a multiple input system insures that each of the individual engine-generator sets is not exceeding its KVA limit since in some cases identical engine-generator sets may operate at different KVA points even though connected to a common system bus.

Thus, in operation, the controller senses the instantaneous power factor via sensor S and provides a control signal from monitor M to excitation current controller E so that the field 40 of generator G is excited to an appropriate level to provide the required KVAR output at switch 44. Once the controller C is on-line and the rig is operating, power factor control is completely automatic and virtually instantaneous thereby reducing voltage fluctuation and minimizing the need to bring on-line additional engine/generator sets to meet peak load demands. It has been found that controller C greatly enhances the fuel efficiency and increases the useful life of on-line machinery thereby greatly reducing the cost of operating an SCR drilling rig.

The foregoing disclosure and description of the invention are illustrative and explanatory thereof, and various changes in the size, shape, materials, components, circuit elements, wiring connections in context, as well as in the details of the illustrated circuitry and construction may be made without departing from the spirit of the invention.

We claim:

1. A method of controlling the system power factor of an alternating current power supply system having one or more engine-generator sets, comprising the steps of:

sensing the instantaneous system power factor;

comparing the sensed instantaneous power factor to a prescribed power factor;

forming a power factor control signal indicative of the difference between the sensed power factor and the prescribed power factor;

providing a field excitation signal to an unloaded, over-excited generator operated in the motor mode in proportion to said power factor control signal to cause the over-excited generator to generate the requisite reactive power to correct the system's power factor to the prescribed power factor; and coupling the output of the over-excited generator to the power system.

2. The method of claim 1, further including the step of:

limiting the field excitation signal to prescribed limits.

3. The method of claim 1, further including the steps of:

sensing the instantaneous output of the reactive power generator;

adjusting the prescribed limits for the field excitation signal in response to the sensed output of the over-exicted generator.

4. A method for controlling the system power factor of an alternating current power supply system having a plurality of engine-generator sets, comprising the steps of:

sensing the instantaneous power factor of each engine-generator set;

comparing the sensed power factor from each engine-generator set to a prescribed power factor;

forming a power factor control signal for each engine-generator set indicative of the difference between the sensed instantaneous power factors and the prescribed power factor;

providing a field excitation signal to a reactive power generator proportionate to the power factor control signal which is indicative of the largest differential between sensed power factor and prescribed power factor;

coupling the output of the reactive power generator to the power system;

whereby the system's power factor is corrected by providing reactive power to the system which is required to correct the individual engine-generator set operating at the worst power factor.

5. The method of claim 4, further including the step of:

limiting the field excitation signal to prescribed limits.

6. The method of claim 5, further including the steps of:

sensing the instantaneous output of the reactive power generator;

adjusting the prescribed limits for the field excitation signal in response to the sensed output of the reactive power generator.

7. An apparatus for controlling the system power factor of an alternating current power system having one or more engine-generator sets, comprising:

means for sensing the instantaneous system power factor;

means for setting a prescribed system power factor;

means for forming a power factor control signal indicative of the difference between the sensed power factor and the prescribed power factor;

means for generating reactive power in response to the power factor control signal, said generating means comprising an unloaded, over-excited generator operated in the motor mode provided with field excitation current proportional to the power factor control signal; and means for providing the generated reactive power to the system to maintain the power factor within the prescribed limits.

8. The apparatus of claim 7, wherein said sensing means comprises:

means for providing a system current signal in phase with system current;

means for providing a system voltage signal in phase with system voltage; and transducer means for determining the cosine of the phase angle between said system current signal and said system voltage signal.

9. The apparatus of claim 7, wherein said means for forming a power factor control signal comprises:

means for forming a signal indicative of the sensed system power factor;

means for forming a signal indicative of the prescribed system power factor; and means for comparing the sensed power factor signal to the desired power factor signal.

10. The apparatus of claim 9, wherein said comparing means comprises a difference amplifier, said difference amplifier being adapted to receive the system power factor signal and the desired power factor signal as inputs, and to provide as an output a power factor control signal proportionate to the difference between the system power factor signal and the desired power factor signal.

11. The apparatus of claim 7, further comprising:

means for limiting the field excitation current to prescribed limits.

12. The apparatus of claim 11, further comprising:

means for sensing the instantaneous voltage output of said generator;

means for adjusting the prescribed limits for excitation current in response to the sensed output of said generator.

13. The apparatus of claim 11, wherein said current limiting means comprises:

means for prescribing a minimum excitation current for said generator.

14. The apparatus of claim 13, wherein the power factor control signal is an analogue direct current voltage signal suitable for application to the field winding of said generator, and wherein said minimum current prescribing means comprises:

means for setting a prescribed minimum excitation voltage for the field windings of said generator;

means for comparing the power factor control signal to the prescribed minimum excitation voltage; and, means for providing the greater of the power factor control signal or the prescribed minimum excitation voltage as the excitation voltage for said generator.

15. The apparatus of claim 14, wherein said minimum voltage prescribing means comprises:
an adjustable step down voltage transformer connected to the power system for providing an alternating current output voltage equivalent to the prescribed minimum excitation voltage;
a rectifier bridge circuit connected to said voltage transformer for rectifying the alternating current voltage output to provide a direct current voltage output equivalent to the prescribed minimun excitation voltage.

16. The apparatus of claim 15 wherein said comparing means comprising:
a rectifier comparator circuit adapted to receive the minimum excitation voltage as a first input voltage and to receive the power factor control signal as a second input voltage and to provide the greater of said first input voltage or said second input voltage as an output to the field winding of said generator.

17. The apparatus of claim 13 further comprising:
means for prescribing a maximum excitation current for said generator.

18. The apparatus of claim 17 wherein the power factor control signal is an analogue direct current voltage signal and wherein said maximum current prescribing means comprises:
a transistor having its collector-emitter circuit connected in series with the field winding of said generator;
a biasing circuit for said transistor adapted to receive said power factor control signal as an input, said biasing circuit being further adapted to provide input biasing voltage to said first transistor in proportion to the power factor control signal to place said first transistor in a conducting state when the power factor control signal is within prescribed maximum limits; and
voltage regulator means, connected to the base-emitter circuit of said transistor for limiting the maximum bias voltage applied to said transistor to that level necessary to prevent the collector-emitter current of said transistor from exceeding the prescribed maximum generator excitation current.

19. An apparatus for controlling the system power factor of an alternating current power supply system having a plurality of engine-generator circuits, comprising:
means for sensing the instantaneous power factors of each of the engine-generator sets;
means for setting a prescribed power factor for each of the engine-generator sets;
means for forming a power factor control signal for each of the engine-generator sets indicative of the difference between the sensed power factor and the prescribed power factor for the particular engine-generator set;
means for selecting the power factor signal indicative of the largest differential between sensed power factor and prescribed power factor;
means for generating reactive power in response to the selected power factor control signal; and
means for providing the generated reactive power to the power system to correct the power factor.

20. A method of controlling the system power factor of an alternating current power supply system having one or more engine-generator sets, comprising the steps of:
sensing instantaneous power factors of one or more engine-generator sets;
deriving a composite power factor by vectorially summing the sensed instantaneous individual power factors;
comparing the composite instantaneous power factor to a prescribed power factor;
forming a power factor control signal indicative of the difference between the sensed composite power factor and the prescribed power factor;
providing a field excitation signal to a reactive power generator in proportion to the power factor control signal to cause the reactive power generator to generate the requisite reactive power to correct the system's power factor to the prescribed power factor; and
coupling the output of the reactive power generator to the power system.

* * * * *